(12) United States Patent
Hanein et al.

(10) Patent No.: US 9,018,616 B2
(45) Date of Patent: Apr. 28, 2015

(54) RECTIFYING ANTENNA DEVICE WITH NANOSTRUCTURE DIODE

(75) Inventors: Yael Hanein, Caesarea (IL); Amir Boag, Yavne (IL); Jacob Scheuer, Ramat-Gan (IL); Inbal Friedler, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 1095 days.

(21) Appl. No.: 13/055,717

(22) PCT Filed: Jul. 23, 2009

(86) PCT No.: PCT/IL2009/000722
§ 371 (c)(1),
(2), (4) Date: Jan. 25, 2011

(87) PCT Pub. No.: WO2010/010562
PCT Pub. Date: Jan. 28, 2010

(65) Prior Publication Data
US 2011/0121258 A1    May 26, 2011

Related U.S. Application Data

(60) Provisional application No. 61/129,878, filed on Jul. 25, 2008.

(51) Int. Cl.
*H01L 29/06* (2006.01)
*H01L 29/86* (2006.01)
(Continued)

(52) U.S. Cl.
CPC ............... *H01L 29/86* (2013.01); *B82Y 10/00* (2013.01); *H01L 27/28* (2013.01);
(Continued)

(58) Field of Classification Search
CPC .......... H02J 17/00; H02J 7/025; H01Q 1/248;
H01L 31/0522; H01L 31/0352; H01L 51/0048; H01L 29/66151; H01L 29/0673; H01L 29/0676; H01L 29/7311; H01L 31/1025; H01L 51/0575; H01L 29/86; H01L 29/0665; H01L 29/1606; H01L 27/28
USPC ............... 257/9, E29.005, E21.358; 438/466; 977/742, 950
See application file for complete search history.

(56) References Cited

U.S. PATENT DOCUMENTS 3,970,839 A    7/1976    Javan
6,380,531 B1   4/2002    Sugihwo et al.
(Continued)

FOREIGN PATENT DOCUMENTS

EP    1353387    10/2003
EP    1699088     9/2006
(Continued)

OTHER PUBLICATIONS

Translation of Office Action dated Feb. 4, 2013 from the State Intellectual Property Office of the People's Republic of China Re. Application No. 200980138397.8.
(Continued)

*Primary Examiner* — Colleen A Matthews
*Assistant Examiner* — Colleen E Snow

(57) ABSTRACT

A rectifying antenna device is disclosed. The device comprises a pair of electrode structures, and at least one nanostructure diode contacting at least a first electrode structure of the pair and being at least in proximity to a second electrode structure of the pair. At least one electrode structure of the pair receives AC radiation, and the nanostructure diode(s) at least partially rectifies a current generated by the AC radiation.

23 Claims, 9 Drawing Sheets

(51) Int. Cl.

| | |
|---|---|
| *B82Y 10/00* | (2011.01) |
| *H01L 27/28* | (2006.01) |
| *H01L 29/16* | (2006.01) |
| *H01L 31/102* | (2006.01) |
| *H01L 51/05* | (2006.01) |
| *H01Q 1/24* | (2006.01) |
| *H01Q 9/28* | (2006.01) |
| *H02S 10/00* | (2014.01) |
| *H01L 51/00* | (2006.01) |

(52) U.S. Cl.
CPC ....... *H01L 29/0665* (2013.01); *H01L 29/0673* (2013.01); *H01L 29/0676* (2013.01); *H01L 29/1606* (2013.01); *H01L 31/1025* (2013.01); *H01L 51/0575* (2013.01); *H01Q 1/248* (2013.01); *H01Q 9/28* (2013.01); *H01Q 9/285* (2013.01); *H02N 6/00* (2013.01); *H01L 51/0048* (2013.01); *Y10S 977/742* (2013.01); *Y10S 977/95* (2013.01)

(56) References Cited

U.S. PATENT DOCUMENTS

| | | | |
|---|---|---|---|
| 6,835,949 B2 * | 12/2004 | Weiss et al. ...................... 257/21 |
| 6,927,387 B2 | 8/2005 | Viktorovitch et al. |
| 2006/0261433 A1 | 11/2006 | Manohara et al. |
| 2007/0240757 A1 | 10/2007 | Ren et al. |

FOREIGN PATENT DOCUMENTS

| | | |
|---|---|---|
| WO | WO 2004/034473 | 4/2004 |
| WO | WO 2005/008710 | 1/2005 |
| WO | WO 2009/152435 | 12/2009 |
| WO | WO 2010/010562 | 1/2010 |

OTHER PUBLICATIONS

Translation of Search Report dated Feb. 4, 2013 from the State Intellectual Property Office of the People's Republic of China Re. Application No. 200980138397.8.

Communication Relating to the Results of the Partial International Search dated Mar. 29, 2010 from the International Searching Authority Re.: Application No. PCT/IL2009/000722.

Corrected International Search Report and the Written Opinion dated Aug. 24, 2010 from the International Searching Authority Re. Application No. PCT/IL2009/000722.

International Preliminary Report on Patentability Dated Feb. 3, 2011 From the International Bureau of WIPO Re. Application No. PCT/IL2009/000722.

International Search Report and the Written Opinion Dated Aug. 6, 2010 From the International Searching Authority Re.: Application No. PCT/IL2009/000722.

Corkish et al. "Solar Energy Collection by Antennas", Solar Energy, XP004421963, 73(6): 395-401, Dec. 1, 2002. Sections 2, 4.2, 4.3.

Mayer et al. "Three-Dimensional Analysis of the Geometrical Rectifying Properties of Asymmetric Metal-Vacuum-Metal Junctions and Extension for Energy Conversion", Physical Review B (Condensed Matter and Materials Physics), XP002591400, 77(8): 085411-1-085411-11, Feb. 15, 2008. p. 085411-2, col. 1, § 1,p. 085411-5, col. 1, Lines 5-27, Section V, Figs.1, 6, Section C.

Sullivan et al. "Proposed Planar Scanning Tunneling Microscope Diode: Application as an Infrared and Optical Detector", IEEE Transactions on Electron Devices, XP000098407, 36(11): 2659-2664, Nov. 1, 1989. p. 2659, col. 2, Lines 4-11, Section II, VII, VIII, Fig.8.

* cited by examiner

FIG. 3A
FIG. 3B
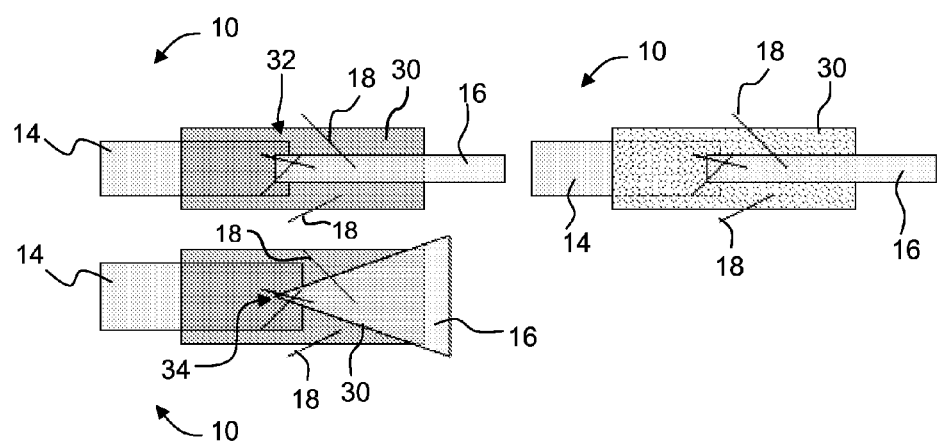
FIG. 3C
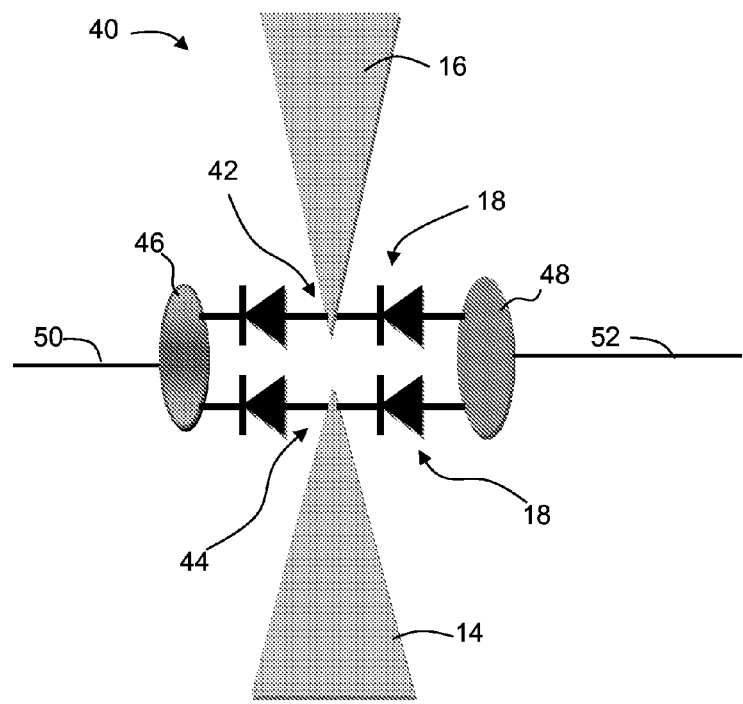
FIG. 4

RECTIFYING ANTENNA DEVICE WITH NANOSTRUCTURE DIODE

RELATED APPLICATIONS

This Application is a National Phase of PCT Patent Application No. PCT/IL2009/000722 having International filing date of Jul. 23, 2009, which claims the benefit of U.S. Provisional Patent Application No. 61/129,878 filed on Jul. 25, 2008. The contents of the above Applications are all incorporated herein by reference.

FIELD AND BACKGROUND OF THE INVENTION

The present invention, in some embodiments thereof, relates to a rectifying antenna device and, more particularly, but not exclusively, to a rectifying antenna device operating in the infrared (IR) and visible light.

There are many applications in which it is useful to beam energy from an energy production location to a destination at which the energy will be used. The "beamed" energy is typically microwave or radiofrequency. However, many applications for the energy require direct current (DC) power.

A rectifying antenna, also known as a "rectenna" is an electrical device which facilitates the conversion of microwave and radiofrequency alternating current (AC) radiation into DC electrical power. The conversion takes place by a rectifying diode which is incorporated into the antenna. In operation, the antenna gathers electromagnetic energy at a frequency consistent with its size and shape, and the diode rectifies that energy into DC voltage.

The rectenna may be used as the receiving terminal of a power transmission system. In this configuration, the terminal may deliver DC power to a load where physical transmission lines are not feasible. The power delivery may be through free space. The rectenna may also be useful in applications where DC power needs to be distributed to a large number of load elements that are distributed spatially.

Traditionally, rectennae utilize a semiconductor diode or large vacuum diode to rectify electromagnetic waves, with frequencies ranging up to the mm-waves band, to direct current. Also known (see e.g., U.S. Pat. No. 5,043,739), are rectennae utilizing a first field emission diode for rectifying a current flow.

Recently, periodic and random arrays of multi-walled carbon nanotubes (MWCNTs) have been synthesized on various substrates. Each nanotube in the array is a conducting rod of about 10-100 nm in diameter and 200-1000 nm in length. Therefore, one can view interaction of these arrays with the electromagnetic radiation as that of an array of dipole antennas. MWCNTs arrays have been studied in order to determine the antenna-like interactions, since the most efficient antenna interaction occurs when the length of the antennas is of the order of the wavelength of the incoming radiation.

U.S. Published Application No. 20070240757 discloses a solar cell which includes a planar substrate having a conductor layer below a semiconductor layer, and an array of carbon nanotubes engaging the semiconductor layer at a first end and comprising an optical antenna at a second end. A layer of a rectifying material is deposited onto the nanotubes.

Additional background art includes Weiss et al., "A Novel Nanowire/Nanotube Device Acting as Both Antenna and Rectifier for Solar Energy Conversion up to the Optical," conference abstract, Electronic Materials Conference, 2008; Kempa et al., "Carbon Nanotubes as Optical Antennae," Adv. Mater. 2007, 19, 421-426; U.S. Pat. No. 7,132,994, U.S. Published Application No. 20070240757, Abrams et al., "A Complete Scheme for Creating Large Scale Networks of Carbon Nanotubes," Nano Letters, 7 (2007) 2666-2671; U.S. application Ser. No. 12/155,089; Slepyan et al.," Theory of optical scattering by achiral carbon nanotubes and their potential as optical nanoantennas," Phys. Rev. B. 73, 195416 (2006), B. Berland, "Photovoltaic Technologies Beyond the Horizon: Optical Rectenna Solar Cell," ITN Energy Systems, Inc. Littleton, Colo. (2003); and Levy Yeyati et al., "On the theory of difference frequency generation and light rectification in the scanning tunneling microscope," J. Phys: Condens. Matter 4 (1992) 7341-7354.

SUMMARY OF THE INVENTION

The present Inventors found that rectennae utilizing a semiconductor diode have an upper frequency limit and an upper intensity limit due to the inherent limitations of semiconductor diodes. These limitations include the device capacitance and the fragility of high speed semiconductor devices. Rectennae using large vacuum tubes also have upper frequency limits and are expensive to build. For example, large arrays of rectennae using conventional vacuum tubes would be prohibitively expensive to build, and could not be produced in a compact form.

The present Inventors also found that rectennae utilizing a semiconductor diode fail to operate at high optical and quasi optical frequencies. As a result, traditional energy harvesting devices in the high frequency radiation range (e.g., solar cells) do not rely on the rectifying antenna principle, but rather employ low efficiency solid state photovoltaic cells. Photovoltaic cells are not only limited by low conversion efficiency, but also have to be designed specifically per radiation frequency. This is because in solid state photovoltaic cells the material properties (bang-gap energy, etc.) determine the spectral sensitivity of the device. Thus, photovoltaic cells are limited to specific frequency windows.

The present embodiments comprise a rectenna device having a nanostructure diode device. The nanostructure preferably has sufficiently small dimension and sufficiently high mobility such that the nanostructure diode device has a high cutoff frequency. In various exemplary embodiments of the invention the dimension of the nanostructure is of the order of few nanometers and the mobility is of the order of 10 $m^2/Vs$, resulting in a cutoff frequency in the THz range.

The rectenna device of the present embodiments generally comprises two electrode structures each of nanometric dimension (typically less than 500 nm in length and less than 100 nm in width) interconnected by a nanostructure. Also contemplated are larger antenna devices for more coherent radiation.

In some embodiments of the present invention the electrode structures are of different materials such that the nanostructure connecting the two different materials serves as a rectifying diode.

In some embodiments of the present invention the electrode structures are made of the same materials. In these embodiments, the nanostructure contacts only one of the electrode structures, but its opposite end is in close proximity to the other electrode structure of the pair.

The rectenna device of the present embodiments can have various shapes, such as, but not limited to, a linear shape, a bow tie shape and the like. Several such nanostructure diode devices can be arranged to form a rectification bridge. For example, In some embodiments of the present invention a bow-tie rectenna with a four diode full rectification bridge is provided.

Thus, according to an aspect of some embodiments of the present invention there is provided a rectifying antenna device. The device comprises a pair of electrode structures, and at least one nanostructure diode contacting at least a first electrode structure of the pair and being at least in proximity to a second electrode structure of the pair. At least one electrode structure of the pair receives AC radiation, and the nanostructure diode(s) at least partially rectifies a current generated by the AC radiation.

According to some embodiments of the invention the device further comprises at least one dielectric resonator for receiving and enhancing the AC radiation such that at least one electrode structure of the pair receives the enhanced radiation.

According to an aspect of some embodiments of the present invention there is provided a rectifying antenna system. The system comprises a plurality of rectifying antenna devices, wherein at least one of the rectifying antenna devices is the rectifying antenna device described herein.

According to some embodiments of the invention the rectifying antenna devices are arranged to receive two polarizations.

According to some embodiments of the invention the electrode structures are made, at least in part, of different conductive materials.

According to some embodiments of the invention the nanostructure diode(s) contacts both electrode structures of the pair.

According to some embodiments of the invention the electrode structures are made of the same conductive material.

According to some embodiments of the invention the nanostructure diode(s) contacts one electrode structure of the pair but not the other electrode structure of the pair.

According to some embodiments of the invention the device further comprises at least one additional electrode structure oriented substantially perpendicular to an imaginary axis defined by the pair of electrode structures.

According to some embodiments of the invention the electrode structures are separated by a gap shaped so as to ensure asymmetric electrical configuration.

According to some embodiments of the invention the electrode structures of the pair are substantially planar and are arranged in a partially overlapping manner, wherein the device further comprises a dielectric layer for ensuring that the electrode structures of the pair are devoid of electrical contact thereamongst, and wherein the nanostructure diode(s) contacts one electrode structure of the pair and overlaps the other electrode structure of the pair.

According to some embodiments of the invention the dielectric layer is perforated.

According to an aspect of some embodiments of the present invention there is provided a method of manufacturing a rectifying antenna device. The method comprises: depositioning a first electrode structure on a substrate; depositioning a second electrode structure on the substrate, so as to form a pair of electrode structures being at least partially exposed and devoid of contact thereamongst; and depositioning at least one nanostructure on an exposed part of at least one of the pair so as to form nanostructure diode(s) contacting at least a first electrode structure of the pair and being at least in proximity to a second electrode structure of the pair.

According to some embodiments of the invention the method further comprises depositioning an additional electrode structure on the substrate in a manner such that the nanostructure diode(s) interconnects the first electrode structure and the an additional electrode structure.

According to some embodiments of the invention the additional electrode structure is oriented substantially perpendicular to an imaginary axis defined by the first and the second electrode structures.

According to some embodiments of the invention the method further comprises applying electric field to the additional electrode structure so as to burn a tip of the nanostructure diode(s) hence to prevent contact between the nanostructure diode(s) and the second electrode structure.

According to some embodiments of the invention the first and second electrode structures are laterally displaced by a gap.

According to some embodiments of the invention the method further comprises, prior to the deposition of the second electrode structure, depositioning a dielectric layer such that the dielectric layer partially covers the first electrode structure, wherein the second electrode structure is deposited onto the dielectric layer such that the second electrode structure partially overlaps the first electrode structure, and wherein the at least one elongated nanostructure diode is deposited on the second electrode structure such that the nanostructure diode partially overlaps the first electrode structure.

According to some embodiments of the invention the method further comprises depositioning at least one additional nanostructure for connecting the electrode structures to external devices.

According to some embodiments of the invention the deposition of the nanostructure is effected by a stamping technique.

According to some embodiments of the invention the nanostructure diode(s) comprises a plurality of nanostructure diodes.

According to some embodiments of the invention an amount of the plurality of nanostructure diodes is selected so as to match the impedance of the pair of electrode structures.

According to some embodiments of the invention the pair of electrode structures forms a dipole antenna.

According to some embodiments of the invention the pair of electrode structures forms a bow tie antenna.

According to some embodiments of the invention the bow tie antenna has an asymmetric gap.

According to some embodiments of the invention the device further comprises organic molecules attached to at least one of the pair of electrode structures.

According to some embodiments of the invention the device is configured to rectify radiation in the visible range.

According to some embodiments of the invention the device is configured to rectify radiation in the infrared range.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are In the drawings:

FIGS. 3A-C are schematic illustrations of a rectifying antenna device which includes a dielectric layer between the electrode structures, according to various exemplary embodiments of the present invention; and FIG. 4 is a schematic illustration of a diode bridge rectifier, according to various exemplary embodiments of the present invention.

DESCRIPTION OF SPECIFIC EMBODIMENTS OF THE INVENTION

Figure 1A:
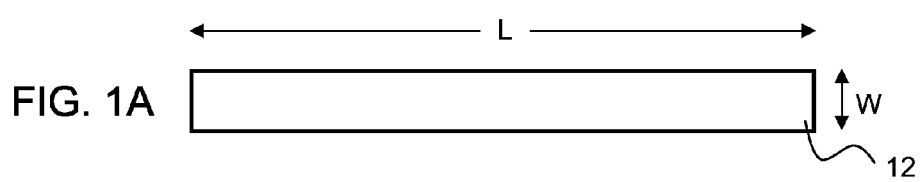
FIGS. 1A-C are schematic illustrations of a dipole rectifying antenna device, according to various exemplary embodiments of the present invention.

The present invention, in some embodiments thereof, relates to a rectifying antenna device and, more particularly, but not exclusively, to a rectifying antenna device operating in the IR and visible light.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1B:
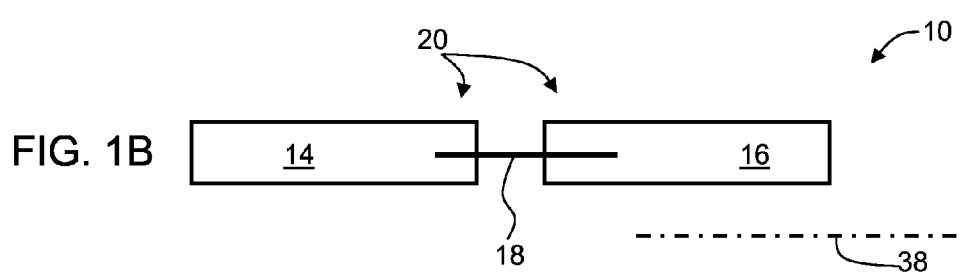
Figure 1C:
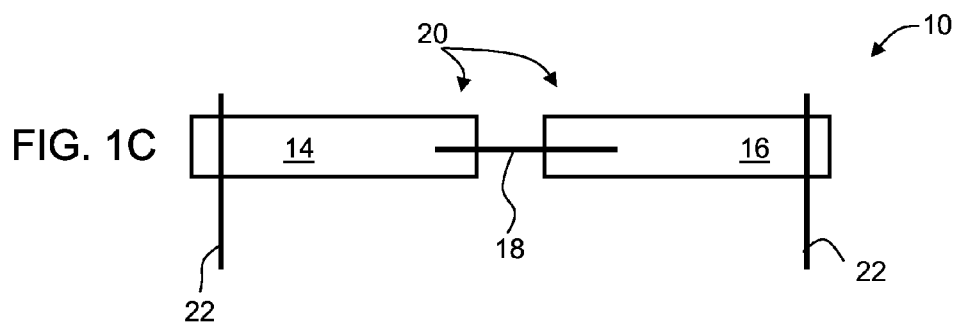

Referring now to the drawings, FIG. 1A-C illustrate a dipole rectifying antenna device, according to various exemplary embodiments of the present invention. FIG. 1A illustrates a simple dipole antenna 12 having a length L and width W which can be a metallic antenna of nanometric size.

The term "nanometric size" as used herein refers to a feature below 1000 nanometers (nm).

For example, the length L of dipole antenna 12 can be about 500 nm, and thw width W of dipole antenna 12 can be below 100 nm. Other dimensions are not excluded from the scope of the present invention.

FIG. 1B illustrates a rectifying antenna device 10 in embodiment of the invention in which device 10 comprises a pair 20 of electrode structures 14, 16 and one or more elongated nanostructure diodes 18 (only one is shown in FIG. 1B for clarity of presentation) interconnecting pair 20. The pair 20 defines an imaginary axis 38 which can be a line connecting the centers of electrode structures 14 and 16. FIG. 1C illustrates device 10 in embodiments in which the device further comprises additional elongated nanostructures 22 for coupling out the rectified signal. Additional elongated nanostructures 22 can be connected to an external device (not shown).

The term "elongated nanostructure" generally refers to any elongated conductive or semiconductor material that includes at least one cross sectional dimension that is less than 500 nm, more preferably less than 100 nm, and has an aspect ratio (length/width) which is greater than 2 or greater than 4 or greater than 8 or greater than 20 or greater than or greater than 50 or greater than 100.

The dimensions of each of electrode structures 14, 16 can be from about 100 nm to about 10 µm in length and from about 20 nm to about 100 nm in width.

One or both electrode structures 14 and 16 receive AC radiation, preferably, but not necessarily in the visible or IR range, and the elongated nanostructure diode(s) 18 at least partially rectifies a current generated by the AC radiation. It is to be understood that device 10 can also be used to rectify AC radiation of other frequencies, including, without limitation, microwave radiation.

In the schematic illustration shown in FIGS. 1B and 1C, electrode structures 14, 16 are elongated and arranged in collinear manner, thus forming a dipole structure, and nanostructure diode 18 is being substantially parallel to electrode structures 14 and 16. However, this need not necessarily be the case, since, for some applications, it may not be necessary for the electrode structures 14, 16 to be elongated and collinear, and for some applications, it may not be necessary for diode 18 to be parallel to pair 20. Thus, in some embodiments of the present invention rectifying antenna device 10 has a structure other than dipole. For example, in some embodiments of the present invention device 10 is a bow-tie antenna device. These embodiments are illustrated in FIGS. 2A-E).

The electrode structures in pair 20 can be made of any conductive material capable of receiving radiation and generating electrical current in response. Representative examples of material pairs suitable for electrode structures 14, 16 include, without limitation titanium-platinum or titanium-gold.

Nanostructure diode(s) 18 can have the shape of a nanotube or a nanowire.

In some embodiments of the present invention at least one of the nanostructure diodes comprises carbon or being made of carbon. In these embodiments, the nanostructure diode is referred to as a carbon nanostructure diode.

In some embodiments of the present invention at least one of the additional nanostructures comprises carbon or being made of carbon. In these embodiments, the nanostructure is referred to as a carbon nanostructure.

In some embodiments of the present invention a carbon nanostructure or a carbon nanostructure diode consists of essentially pure carbon in the form of a tube of what would be planar graphite if flat.

The carbon nanostructure can be a carbon nanotube (CNT) or a carbon nanowire (CNW).

The terms "carbon nanostructure", "carbon nanotube" and "carbon nanowire" are used herein interchangeably.

A carbon nanotube is based on a planar sheet of $sp^2$-bonded carbon. It is commonly acceptable to characterize such sheet by a chiral vector connecting two carbon atoms of the sheet which coincide after folding. The chiral vector is perpendicular to the axis of the nanotube and its length corresponds to the circumference of the nanotube. Mathematically, the chiral vector is defined on a corresponding hexagonal lattice as a linear combination of two independent base vectors, commonly denoted $a_1$ and $a_2$, spanning the lattice. Typically, but not obligatorily, the base vectors $a_1$ and $a_2$ are unit vectors. The coefficients of $a_1$ and $a_2$ form a pair, commonly denoted (n, m), which is referred to as the chirality of the carbon nanotube. Broadly speaking, the chirality expresses the rotation of the symmetry of carbon atoms along the axis of the tube. When one of the coefficients is zero, the carbon nanotube is referred to as a "zigzag nanotube", when the two coefficients equal, the carbon nanotube is referred to as an "armchair nanotube", and a carbon nanotube characterized by two non-zero and different coefficients is referred to as "chiral nanotube".

When the nanostructures or nanostructures diodes are carbon nanotubes, any of the nanotubes can be a zigzag nanotube, an armchair nanotube or a chiral nanotube.

Additionally, the carbon nanostructure of the present embodiments can be single-walled carbon nanotubes (SWCNT), double-walled carbon nanotubes (DWCNT) or multi-walled carbon nanotubes (MWCNT). A SWCNT consists of one graphene sheet rolled into a cylinder, a DWCNT consists of two graphene sheets in parallel, and a MWCNT consists of multiple sheets (typically, but not obligatorily, from about 2 to about 30) graphene. Note that the DWCNT is a member of the MWCNT family.

While the present embodiments are described with a particular emphasis to carbon nanostructures, it is to be understood that more detailed reference to carbon nanostructures is not to be interpreted as limiting the scope of the invention in any way. Thus, any nanoscopic-scale elongated structures can be used, including, without limitation, biologic, organic or inorganic, conductive or semiconducting nanostructures, and the like. Also contemplated are other conductive or semiconducting elements that may not be molecular wires, but are of nanoscopic-scale, e.g., inorganic structures such as main group and metal atom-based wire-like silicon, transition metal-containing wires, gallium arsenide, germanium, cadmium selenide structures, thin metal wires formed by lithographic techniques, and the like. A wide variety of these and other nanoscopic-scale wires can be grown on and/or applied to surfaces in patterns useful for the preparation of the rectifying antenna device of the present embodiments without undue experimentation. For example, elongated organic nanostructures can be prepared according to the teachings of U.S. Pat. No. 6,762,331, elongated biological nanostructures can be prepared according to the teachings of International Patent Publication No. WO2004052773 or International Patent Publication No. WO2004060791 or International Patent Publication No. 2006027780 or U.S. Published Application No. 20030113714, and metallic nanostructures can be prepared according to the teachings of U.S. Pat. No. 6,808,605 or U.S. Published Application No. 20070221917.

The diodic behavior of nanostructure diodes 18 can be ensured by constituting device 10 in an asymmetric electric configuration.

As used herein "asymmetric electric configuration" refers to a configuration in which the charge mobility at one side of the configuration is different from the charge mobility at the other side of the configuration.

Asymmetric electric configuration can be achieved in more than one way. For example, in some embodiments of the present invention pair 20 comprises electrode structures of substantially different work functions.

The work function of a material is defined as the minimal energy which is required for freeing an electron from the surface of the material.

In the embodiments in which the work functions electrode structures 14, 16 differ from one another, device 10 can be of the Conductor-Insulator-Conductor (CIC) type, wherein electrode structures 14, 16 serve as conductors (of different conductivity) and thin dielectric material 30 serves as the insulator. Thus, in these embodiments, electrode structures 14 and 16 are made, at least in part, of different conductive materials, and nanostructure 18 has semiconductor or conductor properties.

Figure 2A:
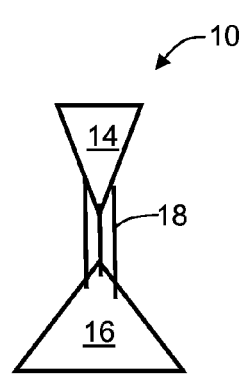
FIGS. 2A-E are schematic illustrations of a bow-tie rectifying antenna device, according to various exemplary embodiments of the present invention.
Figure 2B:
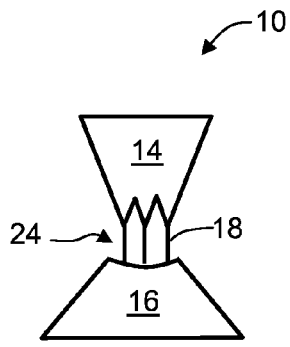

Asymmetric electric configuration can also be achieved by providing asymmetric gap between electrode structures 14 and 16. A representative example of this embodiment is illustrated in FIG. 2B. As shown, in this embodiment, electrode structures 14 and 16 are shaped and arranged to form a bowtie configuration wherein the two electrodes are spaced by an asymmetric air gap 24. Such asymmetric gap configuration provides a polarity-dependent effect that can serve as a field emission diode.

Figure 2C:
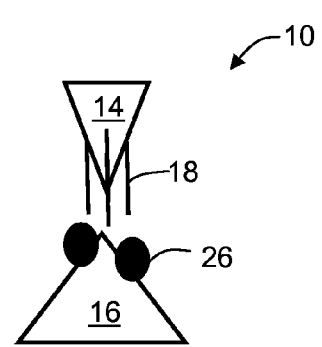

FIG. 2C is a schematic illustration of another embodiment of the present invention in which device 10 further comprises an organic molecule 26, attached to one or more of electrode structures 14, 16. Molecule 26 serves for enhancing the absorbance of radiation by electrode structures 14, 16.

Representative examples of organic molecules suitable for the present embodiments include, without limitation, rhodopsins, particularly, but not exclusively, bacteriorhodopsin, or other photochromic substances that have the property to assume two or more absorbing states in response to electromagnetic radiation of two or more respective wavelengths (to this end see, e.g., U.S. Pat. Nos. 5,346,789, 5,253,198 and 5,228,001]. These substances, exhibit useful photochromic and optoelectrical properties. Bacteriorhodopsin, for example, has large optical nonlinearities and is capable of producing photoinduced electrical signals whose polarity depends on the prior exposure of the material to light of various wavelengths as well as on the wavelength of the light used to induce the signal.

The rhodopsins include the visual rhodopsins, which are responsible for the conversion of light into nerve impulses in the image resolving eyes of mollusks, anthropods, and vertebrates, and bacteriorhodopsin. These proteins also include a class of proteins that serve photosynthetic and phototactic functions. Bacteriorhodopsin is found in nature in a crystalline membrane, called the "purple membrane" of Halobacterium Halobium. This membrane converts light into energy via photon-activated transmembrane proton pumping. Upon the absorption of light, the bacteriorhodopsin molecule undergoes several structural transformations in a well-defined photocycle in which energy is stored in a proton gradient formed upon absorption of light energy. This proton gradient is subsequently utilized to synthesize energy-rich ATP.

The structural changes that occur in the process of light-induced proton pumping of bacteriorhodopsin are reflected in alterations of the absorption spectra of the molecule. These changes are cyclic, and under usual physiological conditions bring the molecule back to its initial state after the absorption of light in about 10 milliseconds. In less than a picosecond after the bacteriorhodopsin absorbs a photon, it produces an intermediate, known as the "J" state, which has a red-shifted absorption maximum. The bacteriorhodopsin also assumes other intermediate states known as "K", "L" and "M".

Each of these intermediate states has the ability to be photochemically converted back to the basic state. Under conditions where a particular intermediate is made stable, illumination with light at a wavelength corresponding to the absorption of the intermediate state in question results in regeneration of the bacteriorhodopsin state. In addition, the bacteriorhodopsin state and intermediates exhibit large two-photon absorption processes which can be used to induce interconversions among different states.

Additionally, there is a light-induced vectorial charge transport within the bacteriorhodopsin molecule. Such a charge transport can be detected as an electric signal having a polarity which depends on the physical orientation of molecules as well as on the photochemical reaction induced.

Figure 2D:
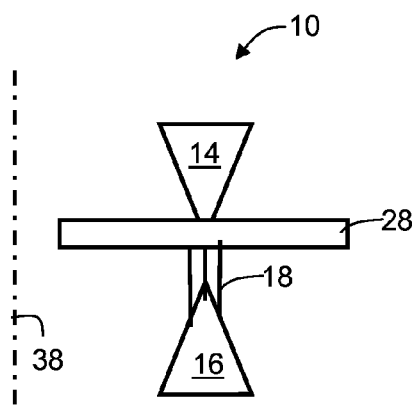
Figure 2E:
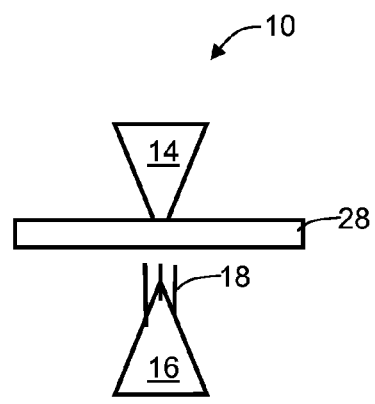

Asymmetric electric configuration can also be achieved by providing different levels of electrical contact at the two ends of nanostructure 18. For example, in some embodiments of the present invention device 10 comprises a pair of electrode structures and one or more nanostructure diodes arranged such that the nanostructure diode contact only one of the electrode structures of the pair but its opposite end is in close proximity to the other electrode structure of the pair. In these embodiments, electrode structures 14 and 16 can be made of the same material or different materials, as desired. A representative example for implementing these embodiments is illustrated in FIG. 2E. As shown, nanostructures 18 contact electrode structure 16 but not electrode structure 14. In some embodiments, device 10 further comprises an additional electrode 28 located at the gap between nanostructures 18 and electrode structure 14. Electrode 28 is preferably oriented substantially perpendicularly to axis 38. Electrode 28 is typically utilized during the manufacturing process of device 10. Firstly, device 10 is fabricated such that nanostructures 18 extend from electrode structure 16 to additional electrode 28 (see FIG. 2D). Subsequently, AC electric field, polarized perpendicularly to axis 38, or DC electric field with contacts to electrode 28) is applied to generate current through additional electrode 28. The intensity of the applied electric field is selected such that the intensity of the generated electric field is sufficient to burn nanostructures 18 at the vicinity of additional electrode 28 (FIG. 2E). A method for fabricating device 10 according to various exemplary embodiments of the present invention is described in more details hereinunder.

Asymmetric electric configuration can also be achieved by a partial overlap between electrode structures 14 and 16. This can be achieved, for example, by substantially planar pair of electrode structures, as schematically illustrated in FIGS. 3A-C. As shown, electrode structures 14 and 16 are generally planar and there is an overlap region (indicated at 32 only in FIG. 3A for clarity of presentation) between electrode structures 14 and 16. The electrical asymmetry in these embodiments is therefore ensured by geometrical asymmetry between the elongated nanostructure diode(s) 18 and the planar underlying electrode structures.

Electrode structures 14 and 16 are separated, at least at overlap region 32, by a dielectric layer 30. FIGS. 3A-C are top views of device 10 wherein electrode structure 14 engages a plane which is below electrode structure 16 and layer 30, and electrode structure 16 engages a plane which is above electrode structure 14 and layer 30.

Layer 30 also separates nanostructure diode(s) 18 from electrode structure 14 thus further facilitating asymmetric electrical configuration whereby nanostructure diode(s) 18 contact electrode structure 16 but not electrode structure 16. In these embodiments, electrode structures 14 and 16 can be made of the same material or different materials, as desired.

In various exemplary embodiments of the invention the dielectric layer is perforated so as to enhance the injection of electrons between nanostructure diodes 18 and electrode structure 14 (see FIG. 3B). The perforation can be effected by any procedure known in the art. For example, holes can be drilled in dielectric layer 30, either prior or subsequent to the deposition of nanostructure diodes 18 thereon. The latter is advantageous from the standpoint of field and rectification enhancement.

Although planar electrode structures 14 and 16 are illustrated in FIGS. 3A and 3B, this need not necessarily be the case. The present inventors contemplate any geometrical shapes for the planar electrode structures. For example, the shape of one of the electrode structures (say, the top electrode structure 16) can be selected to reduce the area of overlap region 32. An exemplified configuration in which electrode structure 16 has a triangular shape wherein the overlap is only at the tip 34 of the triangular, is illustrated in FIG. 3C. Small overlap area is advantageous when it is desired to maintain small shunt capacitance.

The distance between nanostructure diode(s) 18 and electrode structure 14 is therefore approximately the same as the thickness of layer 30. In various exemplary embodiments of the invention the thickness of layer 30 is preferably selected such that nanostructure diode(s) 18 are sufficiently proximate to electrode structure 14. Typically the thickness of layer 30 is about 5 nm.

In various exemplary embodiments of the invention there is a plurality of nanostructure diodes. Multiple nanostructure diodes can be used to reduce the loading impedance. For maximum energy harvesting (received power) the loading impedance matches that of the antenna. For a typical dipole antenna the antenna radiation impedance is about 70Ω at resonance. The typical impedance associated with a single CNT is about 6 kΩ Thus, in various exemplary embodiments of the invention an array of carbon nanostructure diodes interconnects the pair.

The term "array" as used herein, refers to a plurality of nanostructures that are attached to a material proximally to one another.

Following are various embodiments of the present invention which utilize rectifying antenna device 10.

FIG. 4 is schematic illustrations of a diode bridge rectifier 40, according to various exemplary embodiments of the present invention. This configuration can be used to increase the rectenna efficiency, and to provide a full or nearly full rectification. For clarity of presentation, nanostructure diodes 18 are illustrated using diode notations. Electrode structures 14 and 16 are illustrated in the bow-tie arrangement but any of the aforementioned configurations can be employed. Nanostructure diodes 18 are aligned between two contact pads 46 and 48 such as to form a diode bridge.

Leads 50 and 52 are preferably of nanometric dimension. For example, leads 50 and 52 can have similar structure and dimensions as nanostructures 18. In various exemplary embodiments of the invention leads 50 and 52 are CNTs.

The operational principle of bridge rectifier 40 is as follows. AC radiation is received by electrode structures 14 and 16. In half cycles of the AC radiation at which electrode 14 is positive and electrode 16 is negative, current flows leftwards along the left segment of the lower nanostructure diode 18 and the right segment of the upper nanostructure diode 18. In half cycles of the AC radiation at which electrode 14 is negative and electrode 16 is positive, current flows leftwards along the left segment of the upper nanostructure diode 18 and the right segment of the lower nanostructure diode 18, thus making, one again, lead 50 positive and lead 52 negative. Thus, in both halves of the cycle lead 50 is positive and lead 52 is negative, and the radiation is rectified.

Figure 5A:
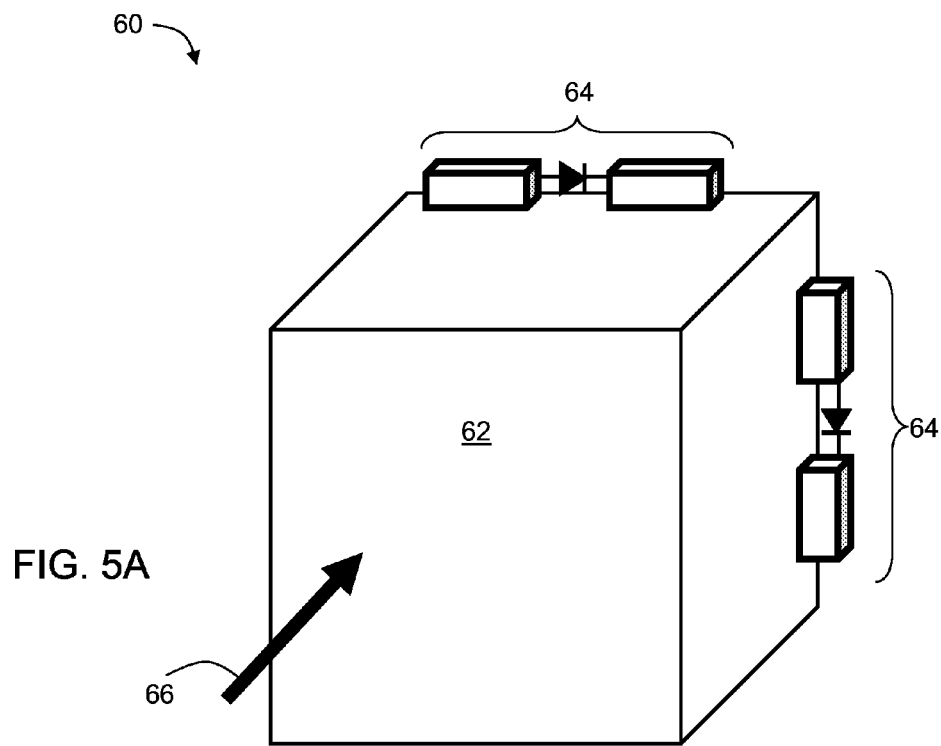
FIGS. 5A-C are schematic illustrations of rectifying antenna system, according to various exemplary embodiments of the present invention.
Figure 5B:
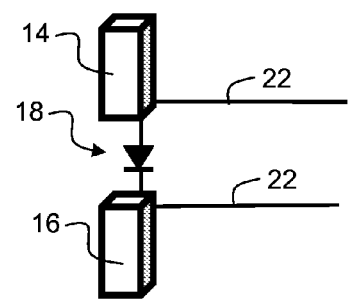
Figure 5C:
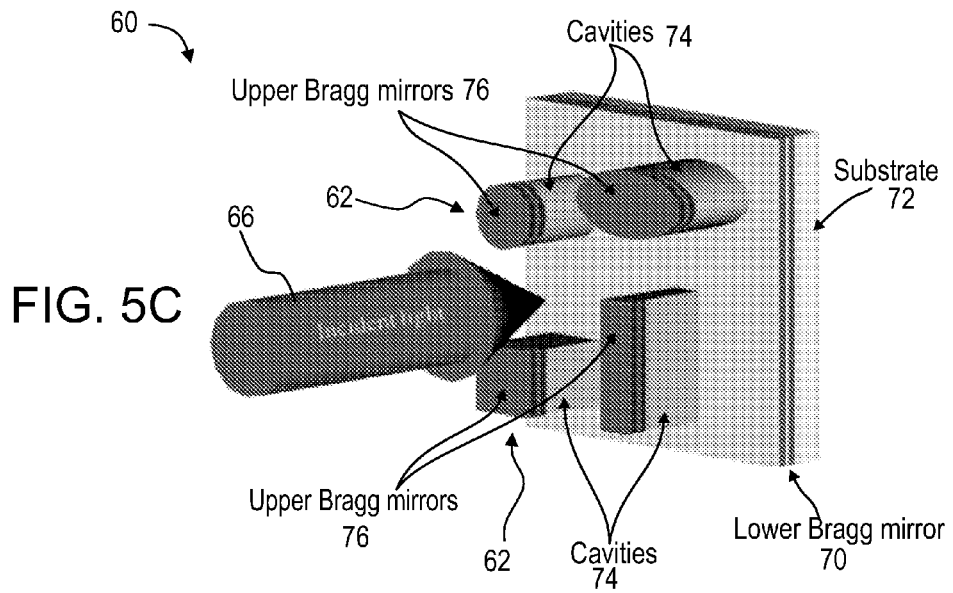

FIGS. 5A-C are schematic illustrations of rectifying antenna system 60, according to various exemplary embodiments of the present invention. System 60 comprises one or more dielectric resonators 62 and two or more rectifying antenna devices 64 at various orientations. Resonator 62 preferably possesses sufficient symmetry to facilitate two orthogonal resonant modes at the same frequency. Such modes are often referred to as degenerate modes. Representative examples of resonators suitable for the present embodiments include, without limitation, spherical resonator, circular cylindrical resonator, cuboid resonator and the like. Resonator 62 can also be in the form of micro-cavity or nano-cavity in photonic crystals which also have degenerate modes. In the representative example of FIG. 5A, resonator 62 is shaped as a cube.

Resonator 62 serves for enhancing the fields of the incoming radiation, thus enabling utilization of small size rectifying antenna devices 64. For example, in some embodiments of the present invention the overall length of each rectifying antenna devices 64 is less than 1 μm which is substantially smaller than the size of conventional antennas which are based on metallic conductors and devoid of nanostructure diodes. Small size rectifying antenna devices are advantageous from the stand point of reduced conductive losses and improved antenna efficiency, particularly at visible and IR frequencies.

The rectifying antenna devices are arranged at two or more different orientations so as to allow system 60 to collect and rectify radiation at arbitrary polarization. In the representative example of FIG. 5A, system 60 comprises two antenna devices 64 arranged on adjacent facets of resonator 62 such that they are perpendicular to one another.

Each of the rectifying antenna devices 64 can be the same or similar to rectifying antenna device 10 according to any of the embodiments described above. FIG. 5B is a schematic illustration of one of devices 64. As shown, device 64 comprises a pair of electrode structures 14 and 16, and one or more diode nanostructures 18 as further detailed hereinabove. Optionally, device 64 comprises additional elongated nanostructures 22 for coupling out the rectified signal.

AC radiation 66, which may be of arbitrary polarization, impinges on a facet of resonator 62 which is perpendicular to the facets engaging devices 64. The orthogonal modes of resonator 62 can be excited by the orthogonal polarizations of the AC radiation 66 and coupled to devices 64, thus facilitating reception and rectification of all incoming radiation of arbitrary polarization. This feature is particularly useful, for example, for rectification of solar radiation which has random time varying polarization.

FIG. 5C is a schematic illustration of system 60 in embodiments in which dielectric resonator 62 which is based on Bragg reflection. Shown in FIG. 5C are several dielectric resonators 62 of various shapes. For clarity of presentation, devices 64 are not shown in FIG. 5C, but the ordinarily skilled person would know how to add two or more devices 64 to each of resonators 62.

System 60 comprises a substrate 72 coated by a Bragg mirror 70, and resonators 62 are arranged on the coated side of substrate 72, namely on Bragg mirror 70. At least some of resonators 62 comprise a dielectric cavity 74 coated by Brag mirrors 76 such that cavity 74 is between Bragg mirror 70 and Bragg mirror 76.

Bragg mirrors are known in the art. For example, mirrors 70 and 76 can be formed by depositing alternating layers of high refraction index and low refraction index materials whose thicknesses are selected according to the desired reflection band and the number of layers is selected according to the desired Finesse.

Cavities 74 are preferably of Fabri-Perot type and they can have any cross-section, such as, but not limited to, rectangular cross-section, circular cross-section, elliptical cross-section, polygonal cross-section, and the like.

The overall thickness of the cavity is preferably selected in accordance with the desired resonance frequency of the resonators according to the formula $\omega_m = \pi m c/n_{\it eff} H$ where m is an integer, $n_{\it eff}$ is the effective refraction index, c is the speed of light in vacuum, H is overall thickness of the cavity and $\omega_m$ is the (angular) resonance frequency.

Electromagnetic radiation 66 illuminates the cavities and builds up therein. The intensity enhancement of the field inside the cavity is determined by the Finesse.

The rectifying antenna device and system of the present embodiments can be fabricated by any technique known in the art.

For example, in some embodiments of the present invention, the rectifying antenna device is fabricated by depositioning of a first electrode structure on a substrate; depositioning of a second electrode structure on the substrate, so as to form a pair of laterally displaced electrode structures being at least partially exposed and devoid of contact thereamongst, and depositioning of at least one nanostructure (e.g., carbon nanostructure) on exposed parts of the electrode structures so as to form at least one nanostructure diode interconnecting electrode structures.

Figure 6A:
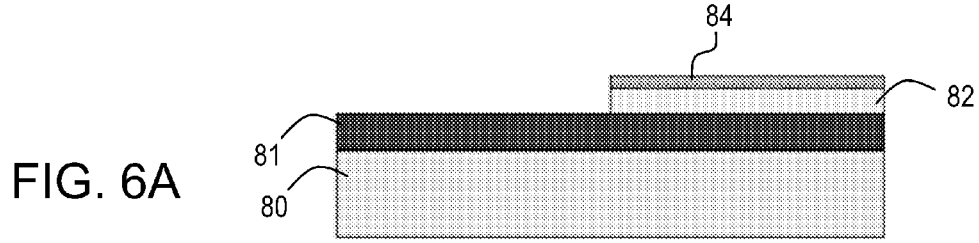
FIGS. 6A-C are schematic illustrations of a process suitable for forming the rectifying antenna device, according to various exemplary embodiments of the present invention.
Figure 6B:
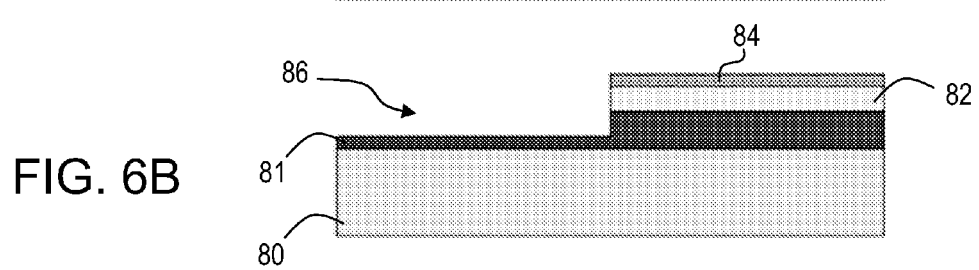
Figure 6C:
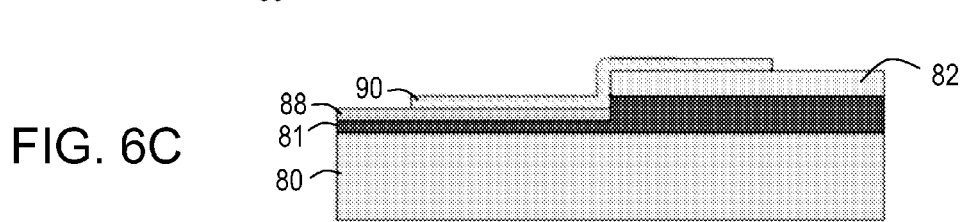

The method is schematically illustrated in the process diagrams of FIGS. 6A-C. FIG. 6A illustrates fabrication stages which include deposition of a first conductive (e.g., metallic) layer 82 on an oxide film 81 (e.g., silicon dioxide) coating a substrate 80 (e.g., silicon wafer), followed by selective etching of layer 82. The selective etching is preceded by a lithography process, which may be photolithography or any other lithography such as, but not limited to, electron beam lithography. Also shown in FIG. 6A is a photoresist mask 84 on layer 82. FIG. 6B illustrates fabrication stages which include self-aligned oxide etch 86.

FIG. 6C illustrates fabrication stages which include deposition of a second conductive (e.g., metallic) layer 88 on the etched oxide film 81 followed by removal of photoresist mask 84, and deposition of an elongated nanostructure 90 (e.g., a CNT). The deposition of nanostructure 90 can be done, for example, via chemical vapor deposition, thermal chemical vapor deposition, stamping techniques, vapor phase growth or the like, as known in the art.

As shown, nanostructure 90 engages two different planes over substrate 80. Following deposition of nanostructures additional patterning and etching may be employed. Layers 82 and 88 serve as the electrode structures and nanostructure 90 serves as the nanostructures diode of the rectifying antenna device.

The process may also comprise additional optional stages such as deposition of additional nanostructures which may serve additional nanostructures diodes or for coupling out the rectified signal.

Although the nanostructure diode is shown in FIG. 6C as contacting both electrode structures, this need not necessarily be the case, since for some embodiments, particularly, but not exclusively, embodiments in which both electrode structures are of the same material, the nanostructure can contact only one of the electrode structure, while being only proximate to the other. A rectifying antenna device according to these embodiments can be fabricated in more than one way.

For example, the fabrication may include deposition of a dielectric layer to separate between the two electrodes. A representative example of such process is illustrated in FIGS.

Figure 7A:
FIGS. 7A-F are schematic illustrations of another process suitable for forming the rectifying antenna device, according to various exemplary embodiments of the present invention.

7A-F. FIG. 7A illustrates a substrate 100 coated by an oxide film 102 (e.g., silicon dioxide) on which the rectifying antenna device is fabricated.

Figure 7B:
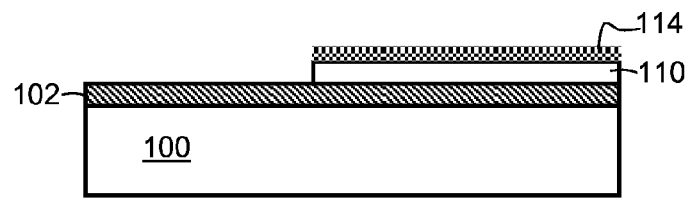

FIG. 7B illustrates fabrication stages which include deposition of a first conductive (e.g., metallic) layer 110 on film 102 followed by selective etching of layer 110. The selective etching is preceded by a lithography process, which may be photolithography or any other lithography such as, but not limited to, electron beam lithography. Also shown in FIG. 7B is a photoresist mask 114 on layer 110.

Figure 7C:
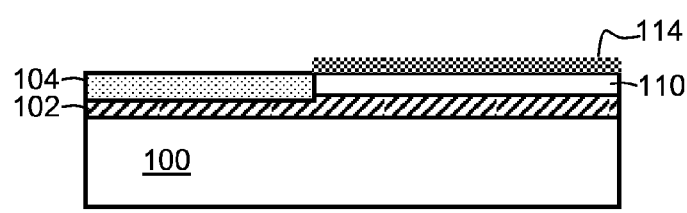

FIG. 7C illustrates fabrication stages which include partial etching of oxide film 102 followed by deposition of an insulator layer 104 thereon and removal of mask 114.

Figure 7D:
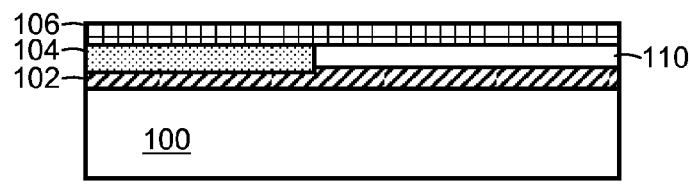

FIG. 7D illustrates fabrication stages which include deposition of dielectric layer 106 so as to coat both insulator layer 104 thereon and conductive layer 110.

Figure 7E:
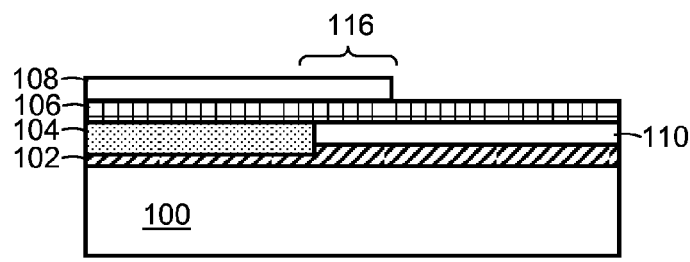

FIG. 7E illustrates fabrication stages which include deposition of a second conductive (e.g., metallic) layer 108 on dielectric layer 106, such that there is an a region 116 at which layers 108 and 110 overlap but are separated by layer 106.

Figure 7F:
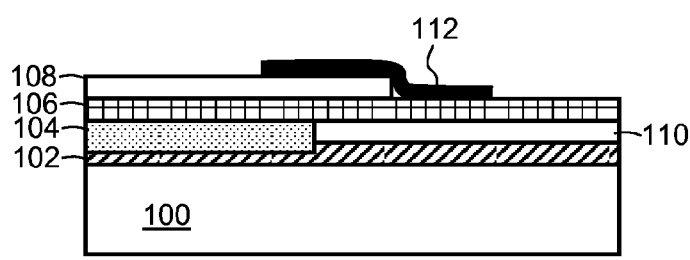

FIG. 7F illustrates fabrication stages which include deposition of an elongated nanostructure 112 (e.g., a CNT) such that nanostructure 112 contacts layers 108 and 106.

A rectifying antenna device in which the nanostructure contacts only one of the electrode structures can also be fabricated by utilizing an additional electrode which is thereafter used for burning the tip of the nanostructures. Selected stages of the fabrication process according to these embodiments are illustrated schematically in FIGS. 2D and 2E. Generally, these embodiments comprise deposition of a pair of electrode structures a substrate (electrode structures 14 and 16 in FIGS. 2D and 2E), deposition of one or more additional electrode structures (electrode structure 28 in FIGS. 2D and 2E). All electrode structure 14, 16 and 28 can be made of the same material. Alternatively, the materials of two or more of electrode structure 14, 16 and 28 can differ. These embodiments further comprise deposition of one or more nanostructures (e.g., CNT) on exposed parts of the electrode structures. For example, nanostructures can contact electrode structures 16 and 28 as shown in FIG. 2D. In various exemplary embodiments of the invention the additional electrode structure 28 is oriented perpendicularly to electrode structures 14 and 16 so as to receive/interact with AC radiation of perpendicular polarization.

The deposition of electrode structures and nanostructures can be done by any technique known in the art such or be executing selected operations of the fabrication processes described above.

Once the electrode structures and nanostructures are deposited, electric field is applied to additional electrode 28 such as to generate current at sufficient intensity to burn the nanostructures at the vicinity of additional electrode 28 (FIG. 2E).

In any of the above embodiments, the deposition of nanostructures and/or nanostructure diodes can be followed by application of electromagnetic field for manipulating the nanostructure so as to align of the nanostructure. This embodiment is particularly useful when there is a gap between the electrode structures in the pair (see, e.g., FIGS. 1B, 1C, and 2A-E), because the electromagnetic field is enhanced in the gap leading to alignment of the nanostructure along the antenna direction. Electromagnetic field alignment can be used for example with randomly distributed nanostructures such as CNTs after chemical vapor deposition growth.

The deposition of nanostructures and nanostructure diodes of the present embodiments can also be implemented by a stamping techniques, such as the techniques disclosed in U.S. application Ser. No. 12/155,089, the contents of which are hereby incorporated by reference.

Figure 8A:
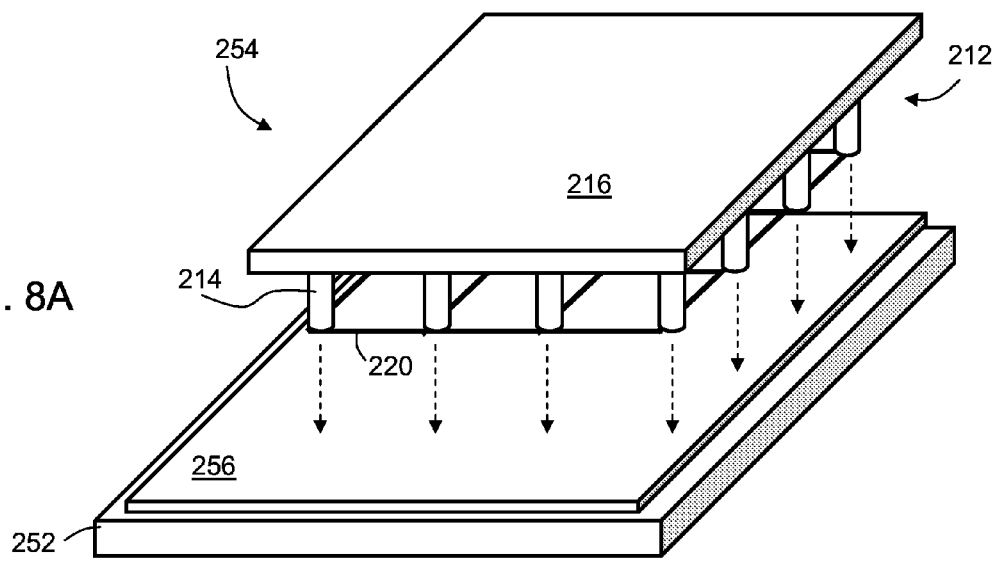
FIGS. 8A-C are schematic illustrations of a process which can be utilized for the deposition of nanostructures, according to various exemplary embodiments of the present invention.
Figure 8B:
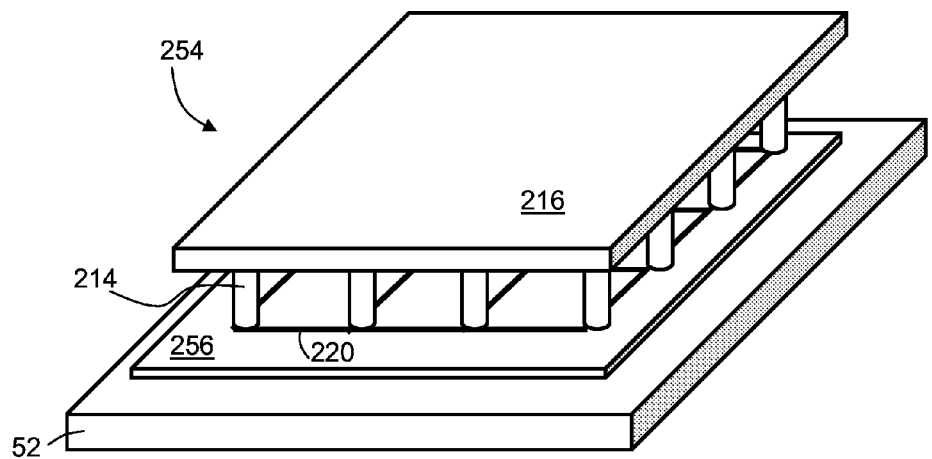
Figure 8C:
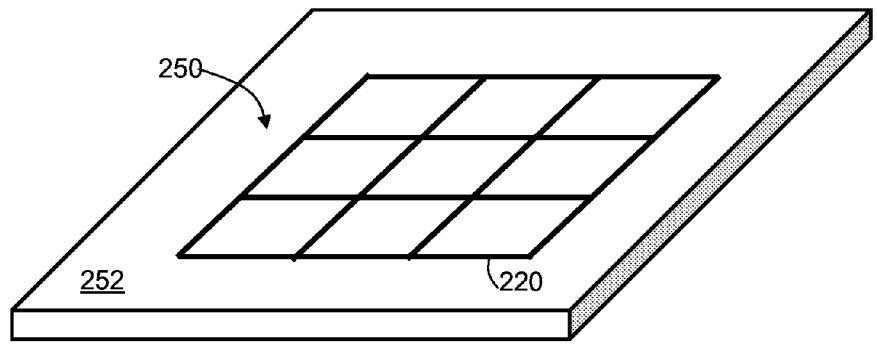

These embodiments are schematically illustrated in FIGS. 8A-C. A target substrate 252 which preferably already includes electrode structures (not shown) thereon, and a nanostructures stamping device 254 which comprises a template structure 212, are provided.

Template structure 212 preferably comprises a support structure 214 formed on or attached to a substrate 216, which is typically planar. Support structure 214 serves for supporting a network of nanostructures 220. In the embodiment illustrated in FIGS. 8A-C, support structure 214 is shown as a plurality of spatially separated pillars. However, this need not necessarily be the case, since, for some applications, it may not be necessary for support structure 214 to be shaped as pillars. For example, support structure 214 can have the shape of a grooved grating or the like. Further, although support structure 214 is illustrated as comprising 16 pillars, this need not necessarily be the case, since, for some applications the number of pillars is not necessarily 16. Yet, in various exemplary embodiments of the invention at least two pillars are used.

When two or more pillars are employed, they are preferably arranged generally perpendicularly to substrate 216.

The term "generally perpendicularly" refers to an angular relationship between the pillar and a plane, e.g., the surface of substrate 16. The pillars are said to be generally perpendicular to the plane if the angle between the pillars and the normal to the plane is, on the average, less than 10°, more preferably less than 5°, more preferably less than 2°, say 1° or less.

A preferred technique for fabricating stamping device 254 is provided hereinunder.

Nanostructure 220 are preferably detachably supported by pillars 214 to allow transfer of nanostructure 220 to target substrate 252. Target substrate can be of any type and is preferably selected in accordance with the application for which the nanotube network is designed, representative examples include, without limitation, glass, quartz, silicon, plastic, polymeric material and the like. At least one advantage of the present embodiments is that the technique allows the formation of a nanotube network on many types of substrates because the nanostructure are transferred to the substrate rather than being grown thereon.

In some embodiments of the present invention target substrate 252 is prepared to the transfer. This can be done, for example, by applying a layer 256 of a buffering medium, preferably in a liquid form, on target substrate 252. Representative examples of buffering media suitable for the present embodiments include, without limitation, ethanol, hexane, de-ionized water, acetone, iso-propynol and photoresist. In some embodiments of the present invention ethanol is used as the buffering medium.

The advantage of using a buffering medium is that it reduces the potential disruptive effect of nano-scaled impurities or imperfections, which may be present on target substrate 252, on the transfer.

Whether or not a buffering medium is applied on target substrate 252, a contact is established (see FIG. 8B) between stamping device 254 and target substrate 252 so as to transfer nanostructure 220 from template structure 212 to target substrate 252 (see FIG. 8C), hence to form a nanotube network 250 on target substrate 252. The transfer is caused by the interactions between the suspended nanotube segments and target substrate 252. The detachment of nanostructure 220 from template structure 212 is enabled due to the relatively large surface contact area between nanostructure 220 and substrate 252, as opposed to the relatively small section of the nanostructure which contacts the pillars.

Although FIGS. 8A and 8B show that stamping device 254 is brought to a contact with target substrate 252 from above, this need not necessarily be the case, since in some embodiments stamping device 254 is brought to a contact with target substrate 252 from below. Furthermore although FIGS. 8A and 8B show that target substrate 252 is kept still and stamping device 254 is brought to a contact therewith, this need not necessarily be the case, since in some embodiments stamping device 254 is kept still and target substrate 252 is brought to a contact therewith, either from below or from above.

The ambient conditions at which the contact between stamping device 254 and target substrate 252 is established are selected such as to facilitate the transfer of the network to the target surface. For example, the contact can be at elevated temperatures. In some embodiments of the present invention the contact is established on the surface of a hot plate (heated, e.g., to about 100° C.) to allow rapidly evaporation of the buffering medium.

Also contemplated, is a stamping procedure under vacuum conditions. For example, once the buffering medium is applied and stamping device 254 is brought to contact with target substrate 252, both device 254 and substrate 252 can be placed in a vacuum chamber. Pumping can then be initiated so as to evacuate the buffering medium between the pillars, thereby to create pressure between stamping device 254 and target substrate 252.

Further contemplated is a technique in which a precursor stamp is used for the transfer. In this embodiment stamping device 254 is first pressed against a planar precursor stamp which may be a polymer, such as, but not limited to, polymethyl methacrylate (PMMA). The precursor stamp serves as a pliable layer which readily complies with the nano-topography caused by possible imperfections on the distal surfaces of the pillar and/or the target substrate. The pliable layer also adheres to the nanostructure. Subsequently, the precursor stamp can be pressed against the target substrate and the polymer can be dissolved in a suitable solution (e.g., acetone).

Figure 9A:
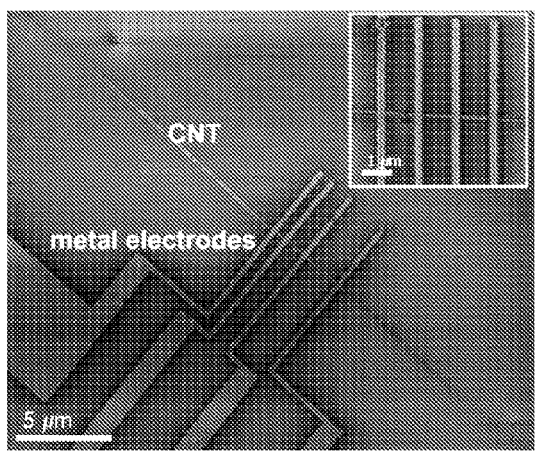
FIGS. 9A and 9B are high resolution scanning electron microscope images of straight carbon nanotubes electrically wired using metallic electrodes, as deposited on a substrate containing the metallic electrodes using the stamping technique of the present embodiments.
Figure 9B:
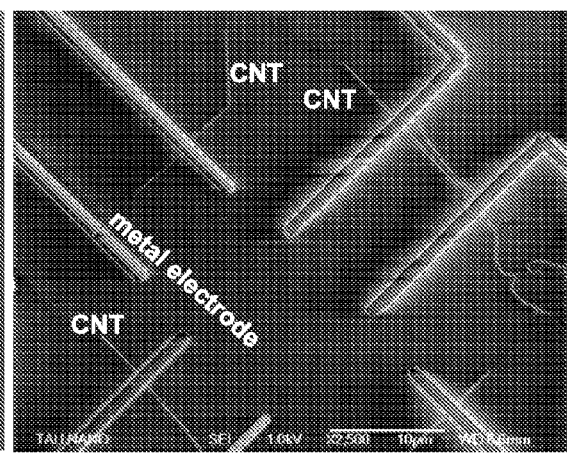

FIGS. 9A and 9B are high resolution scanning electron microscope images of straight carbon nanotubes electrically wired using metallic electrodes. The straight carbon nanotubes were deposited on a substrate containing the metallic electrodes using the stamping technique described above.

Reference is now made to FIGS. 10A-F which are schematic illustrations describing a method suitable for fabricating a stamping device (e.g., stamping device 254) according to various exemplary embodiments of the present invention.

Figures 10A, 10B:
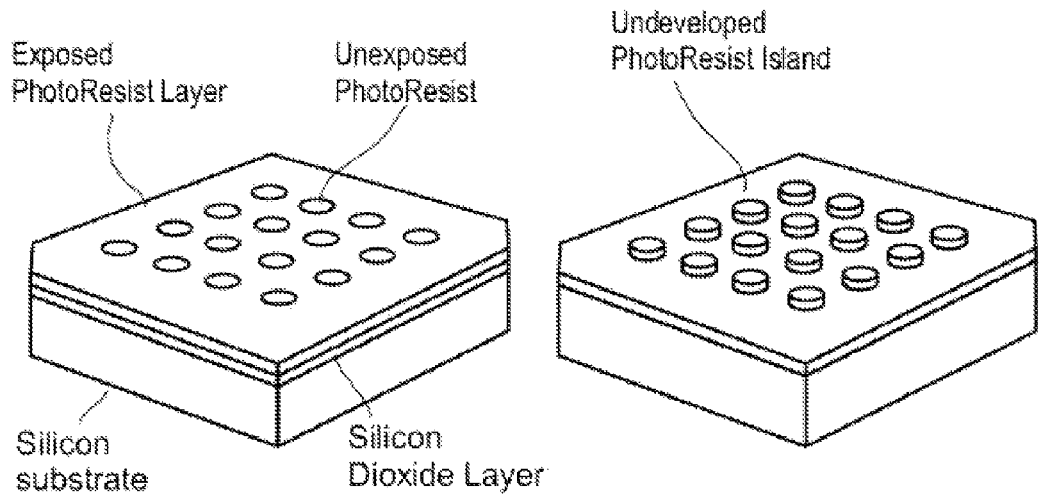
FIGS. 10A-F are schematic illustrations describing a method suitable for fabricating a stamping device according to various exemplary embodiments of the present invention.
Figures 10C, 10D:
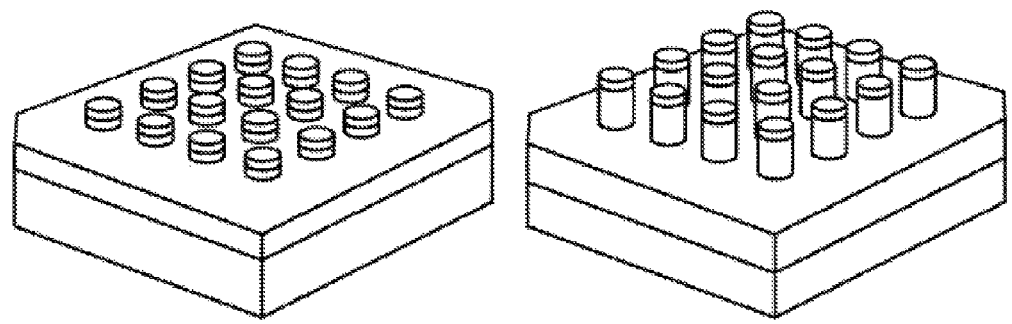

FIGS. 10A-D illustrate a preferred process for forming template structure 212. A substrate, for example, silicon dioxide wafer which comprises a thick layer (about 450 µm in thickness) of silicon coated by a thinner layer (about 500 nm) of silicon dioxide, is subjected to photo lithography patterning (FIG. 10A) followed by an exposure to light (e.g., UV exposure) and photo resist development (FIG. 10B). The patterning, exposure and development are for marking the x-y locations and siameters of the pillars. The diameter and spacing between pillars can vary.

An etching process is then applied (FIGS. 10C and 10D) to form the pillars. In some embodiments, the etching procedure includes reactive ion etching (RIE) of the oxide layer followed by deep reactive ion etching (DRIE) of the underlying silicon layer to a predetermined depth, depending on the desired height of the pillars.

Once the pillars are formed, a solution catalyst is applied, for example, by stamping on their distal surfaces. The catalyst can be any catalyst suitable for facilitating nanotubes growth.

Figures 10E, 10F:
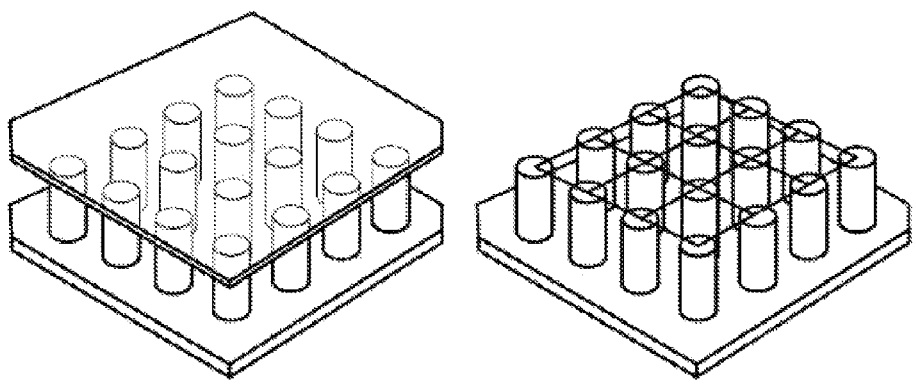

For example, in some embodiments of the present invention the catalyst includes nanoparticles of $Fe_2(NO)_3$ suspended in iso-propynol. Also contemplated is a thin layer of a transition metal, such as, but not limited to, Ni, Fe and Co. The application of catalyst can be, for example, by a stamping technique. In these embodiments, the catalyst solution is applied to a planar template surface, such as, but not limited to, a PDMS template surface, and contact is established between the template surface and the distal surfaces of the pillars, as illustrated in FIG. 10E.

The substrate carrying the pillars with the catalyst are then subjected to nanotube growth process, as known in the art. Any nanotube growth process can be employed, including, without limitation, chemical vapor deposition, thermal chemical vapor deposition, vapor phase growth, and the like. The growth process results in formation of a plurality of suspended nanotubes (see FIG. 10F) supported by the distal surfaces of the pillars as further detailed hereinabove.

The device and system of the present embodiments are useful for a variety of applications.

Generally, the device and system are used for conversion of intense high frequency electromagnetic radiation, particularly in the visible and IR range, into direct current. The device and system of the present embodiments can therefore be utilized for eliminating the need for an active power supply in some applications. In some embodiments of the present invention the device and system are used for collecting solar radiation and converting it to direct current. Thus, for example, the device and system of the present embodiments can be used for powering appliances, such as coolers, or vehicles, such as satellites and unmanned aircrafts, which are regularly exposed to solar radiation.

The device and system of the present embodiments can also be employed in a communication system in which information is transmitted in the form of AC radiation. The device and system can be utilized for the reception of the power in electromagnetic waves and conversion of this power to direct current power, so as to reduce the levels of spurious signals.

The device and system of the present embodiments can also be incorporated a radio frequency identification (RFID) system. A RFID system is a tag device that can respond to being read by sending a content of its embedded memory by backscatter communication to an interrogator. The device and system of the present embodiments can be incorporated in a passive RFID such as to allow it to receives at least a portion, and more preferably all the needed energy, from the carrier signal.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A rectifying antenna device, comprising:
   a pair of substantially planar and partially overlapping electrode structures;
   at least one nanostructure diode contacting at least a first electrode structure of said pair and being at least in proximity to a second electrode structure of said pair; and
   a perforated dielectric layer for ensuring that said electrode structures of said pair are devoid of electrical contact thereamongst;
   wherein at least one electrode structure of said pair receives AC radiation, and said at least one nanostructure diode at least partially rectifies a current generated by said AC radiation.

2. The device of claim 1, wherein said at least one nanostructure diode comprises an elongated nanostructure diode, deposited generally parallel to said pair of electrode structures.

3. The device of claim 1, further comprising at least one dielectric resonator for receiving and enhancing said AC radiation such that at least one electrode structure of said pair receives said enhanced radiation.

4. A rectifying antenna system, comprising a plurality of rectifying antenna devices, wherein at least one of said rectifying antenna devices is the rectifying antenna device of claim 1.

5. The system of claim 4, wherein said plurality of rectifying antenna devices are arranged to receive two polarizations.

6. The device according to claim 1, wherein said electrode structures are made, at least in part, of different conductive materials.

7. The device according to claim 1, wherein said electrode structures are made of the same conductive material.

8. The device according to claim 1, wherein the device further comprises at least one additional electrode structure oriented substantially perpendicular to an imaginary axis defined by said pair of electrode structures.

9. The device according to claim 1, wherein said electrode structures are separated by a gap shaped so as to ensure asymmetric electrical configuration.

10. The device of claim 1, wherein said at least one nanostructure diode comprises a plurality of nanostructure diodes.

11. The device of claim 1, wherein said pair of electrode structures forms a dipole antenna.

12. The device of claim 1, wherein said pair of electrode structures forms a bow tie antenna.

13. The device of claim 12, wherein said bow tie antenna has an asymmetric gap.

14. The device of claim 1, wherein the device further comprises organic molecules attached to at least one of said electrode structures.

15. The device of claim 1, wherein the device is configured to rectify radiation in the visible range.

16. The device of claim 1, wherein the device is configured to rectify radiation in the infrared range.

17. The device of claim 1, wherein said at least one elongated nanostructure comprises carbon nanotube.

18. A method of manufacturing a rectifying antenna device, comprising:
    depositioning a first electrode structure on a substrate;
    depositioning a perforated dielectric layer such that said perforated dielectric layer partially covers said first electrode structure;
    depositioning a second electrode structure on said substrate, such that said second electrode structure partially overlaps said first electrode structure, to form a pair of electrode structures being at least partially exposed and devoid of contact thereamongst; and
    depositioning at least one elongated nanostructure on said second electrode structure such that said elongated nanostructure partially overlaps said first electrode structure, to form at least one nanostructure diode.

19. The method of claim 18, further comprising depositioning an additional electrode structure on said substrate in a manner such that said at least one nanostructure diode interconnects said first electrode structure and said an additional electrode structure.

20. The method of claim 19, wherein said additional electrode structure is oriented substantially perpendicular to an imaginary axis defined by said first and said second electrode structures.

21. The method of claim 19, further comprising applying electric field to said additional electrode structure so as to burn a tip of said at least one nanostructure diode, hence to prevent contact between said at least one nanostructure diode and said second electrode structure.

22. The method according to claim 18, wherein said first and said second electrode structures are laterally displaced by a gap.

23. The method according to claim 18, wherein said depositioning of said nanostructure is effected by a stamping technique.

* * * * *